(12) United States Patent
Asano et al.

(10) Patent No.: US 9,165,685 B2
(45) Date of Patent: *Oct. 20, 2015

(54) SEMICONDUCTOR MEMORY DEVICE

(71) Applicant: KABUSHIKI KAISHA TOSHIBA, Minato-ku (JP)

(72) Inventors: Shigehiro Asano, Kanagawa (JP); Kenichiro Yoshii, Tokyo (JP); Kazuhiro Fukutomi, Kanagawa (JP); Shinichi Kanno, Tokyo (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/313,652

(22) Filed: Jun. 24, 2014

(65) Prior Publication Data
US 2014/0310575 A1 Oct. 16, 2014

Related U.S. Application Data

(60) Division of application No. 13/868,620, filed on Apr. 23, 2013, now Pat. No. 8,788,900, which is a continuation of application No. 12/888,822, filed on Sep. 23, 2010, now Pat. No. 8,448,034.

(30) Foreign Application Priority Data

Feb. 12, 2010 (JP) .................................. 2010-029114

(51) Int. Cl.
*G11C 29/52* (2006.01)
*G06F 11/10* (2006.01)

(52) U.S. Cl.
CPC ............ *G11C 29/52* (2013.01); *G06F 11/1008* (2013.01); *G06F 11/1068* (2013.01)

(58) Field of Classification Search
CPC ............ G06F 11/1008; G06F 11/1068; G06F 11/108; G06F 12/0246; G06F 2212/1036
USPC ........................................ 714/747, 758, 765
See application file for complete search history.

(56) References Cited

U.S. PATENT DOCUMENTS 8,448,034 B2 *  5/2013  Asano et al. .................. 714/747
8,453,033 B2 *  5/2013  Yoshii et al. .................. 714/758

(Continued)

FOREIGN PATENT DOCUMENTS

| JP | 2008-204041 | 9/2008 |
| JP | 2008-226149 | 9/2008 |
| JP | 2008-287404 | 11/2008 |
| WO | WO 2009/042554 A1 | 4/2009 |
| WO | WO 2009/110301 A1 | 9/2009 |

OTHER PUBLICATIONS

David A. Patterson, et al., "A Case for Redundant Arrays of Inexpensive Disks (RAID)", UC Berkeley Technical Report UCB/CSD-87-391, 1988, pp. 109-116.

(Continued)

*Primary Examiner* — Guy Lamarre
(74) *Attorney, Agent, or Firm* — Oblon, McClelland, Maier & Neustadt, L.L.P.

(57) ABSTRACT

According to one embodiment, a semiconductor memory device includes semiconductor memory chips in which data requested to be written. The data has one or more pieces of first data in a predetermined unit. The device includes a write controller that writes the first data and redundancy information calculated by using a predetermined number of pieces of the first data and used for correcting an error in the predetermined number of pieces of the first data into different semiconductor memory chips; and a storage unit that stores identification information and region specifying information so as to be associated with each other. The identification information associates the first data and the redundancy information, and the region specifying information specifies a plurality of storage regions in the semiconductor memory chips to which the pieces of the first data and the redundancy information associated with each other are written.

2 Claims, 11 Drawing Sheets

(56) References Cited

U.S. PATENT DOCUMENTS

2007/0036010 A1 2/2007 Sato
2009/0259919 A1 10/2009 Kilzer et al.
2010/0312948 A1 12/2010 Yano et al.
2011/0214033 A1 9/2011 Yoshii et al.

OTHER PUBLICATIONS

James S. Plank, "A Tutorial on Reed-Solomon Coding for Fault-Tolerance in RAID-like Systems", Technical Report CS-96-332, Department of Computer Science, University of Tennessee, Feb. 19, 1999, 19 pages.
Mendel Rosenblum, et al., "The LFS Storage Manager", The Summer '90 USENIX Technical Conference, Jun. 1990, 16 pages.
Office Action issued Dec. 6, 2011, in Japanese Patent Application No. 2010-029114 (with English-language translation).
Extended European Search Report issued Jul. 25, 2011, in Patent Application No. 11153978.9.
Office Action issued Dec. 12, 2013 in Chinese Patent Application No. 201110036760.4 (with English Translation).

* cited by examiner

SEMICONDUCTOR MEMORY DEVICE

CROSS-REFERENCE TO RELATED APPLICATIONS

This application is a divisional of U.S. application Ser. No. 13/868,620 filed Apr. 23, 2013, which is a continuation of U.S. application Ser. No. 12/888,822 filed Sep. 23, 2010, and is based upon and claims the benefit of priority from the prior Japanese Patent Application No. 2010-029114, filed on Feb. 12, 2010; the entire contents of each of which are incorporated herein by reference.

FIELD

Embodiments described herein relate generally to a semiconductor memory device.

BACKGROUND

It is known that probabilistic failures occur in a semiconductor storage chip. The failures include a failure of a memory cell such as a soft error caused by an alpha beam and a failure in a larger unit such as a failure in a read circuit or an input/output buffer (I/O buffer). For a failure in a memory cell, conventionally, by adding redundant information such as an Error correction code (ECC) to data, erroneous data caused by the failure can be corrected within a predetermined number of errors in a predetermined unit. For a failure in a larger unit such as a failure in a reading circuit or an I/O buffer, the number of errors is extremely large, and it is difficult to perform an error correction by a realistic circuit scale.

In a system employing a number of Hard Disk Drives (HDDs), a failure in an HDD have become a problem. Redundant Array of Inexpensive Disks (RAID) is widely known as a technique for addressing such failure in the HDD unit basis by using an error correction code constituted by a plurality of HDDs (refer to, for example, "A Case for Redundant Arrays of Inexpensive Disks (RAID)", UC Berkeley Technical Report UCB/CSD-87-391, 1987). In this technique, by writing data to a plurality of HDDs and storing redundant information obtained by using the data into one of the HDDs, an error correction code is constituted by the plurality of HDDs. As a method of restoring data with RAIDs when a plurality of HDDs become faulty, a method in which a Reed Solomon code is used is also known (refer to, for example, "A Tutorial on Reed-Solomon Coding for Fault-Tolerance in RAID-like Systems", James S. Plank, Technical Report CS-96-332, Department of Computer Science University of Tennessee).

However, in a semiconductor memory device using a large number of semiconductor storage chips as memory chips, even when an error correction code (ECC) for repairing a failure in a memory cell, the failure in a memory chip cannot be prevented. As a result, it may become a failure of the semiconductor memory device. To address a failure in a memory chip, it is considered to constitute an error correction code by a plurality of memory chips in a manner similar to HDDs. In this method, however, for each writing operation, writing to a memory chip in which redundant information is written is performed for updating redundant information. Concretely, in RAIDs of HDDs, for example, when an error correction code is constituted by four HDDs A, B, C, and D in which data is written and one HDD P in which redundant information is written, the writing operation is performed as follows. If data is written in the HDD A out of the HDDs A, B, C, and D, writing to the HDD P is also performed for updating redundant information.

Meanwhile, a semiconductor memory element of the NAND type (referred to as NAND memory) used for a semiconductor memory device is widely used as a semiconductor memory chip of a Solid State Drive (SSD) because the area per bit is small and it is nonvolatile, but it is widely known that the number of write times is limited. Consequently, it is necessary to reduce the number of write times in order to increase design life of a semiconductor memory device.

DETAILED DESCRIPTION

In general, according to one embodiment, a semiconductor memory device includes a plurality of semiconductor memory chips in which data requested to be written by an information processing apparatus is described. The data has one or more pieces of first data in a predetermined unit. The semiconductor memory device includes a write controller configured to write the pieces of the first data in the predetermined unit and redundancy information into different semiconductor memory chips, the redundancy information being calculated by using a predetermined number of pieces of the first data and being used for correcting an error in the predetermined number of pieces of the first data; and a storage unit configured to store therein identification information and region specifying information so as to be associated with each other, the identification information associating the predetermined number of pieces of the first data and the redundancy information, and the region specifying information specifying a plurality of storage regions in the semiconductor memory chips to which the pieces of the first data and the redundancy information associated with each other are written.

Exemplary embodiments of a semiconductor storage device will be described in detail below with reference to the appended drawings.

Figure 1:
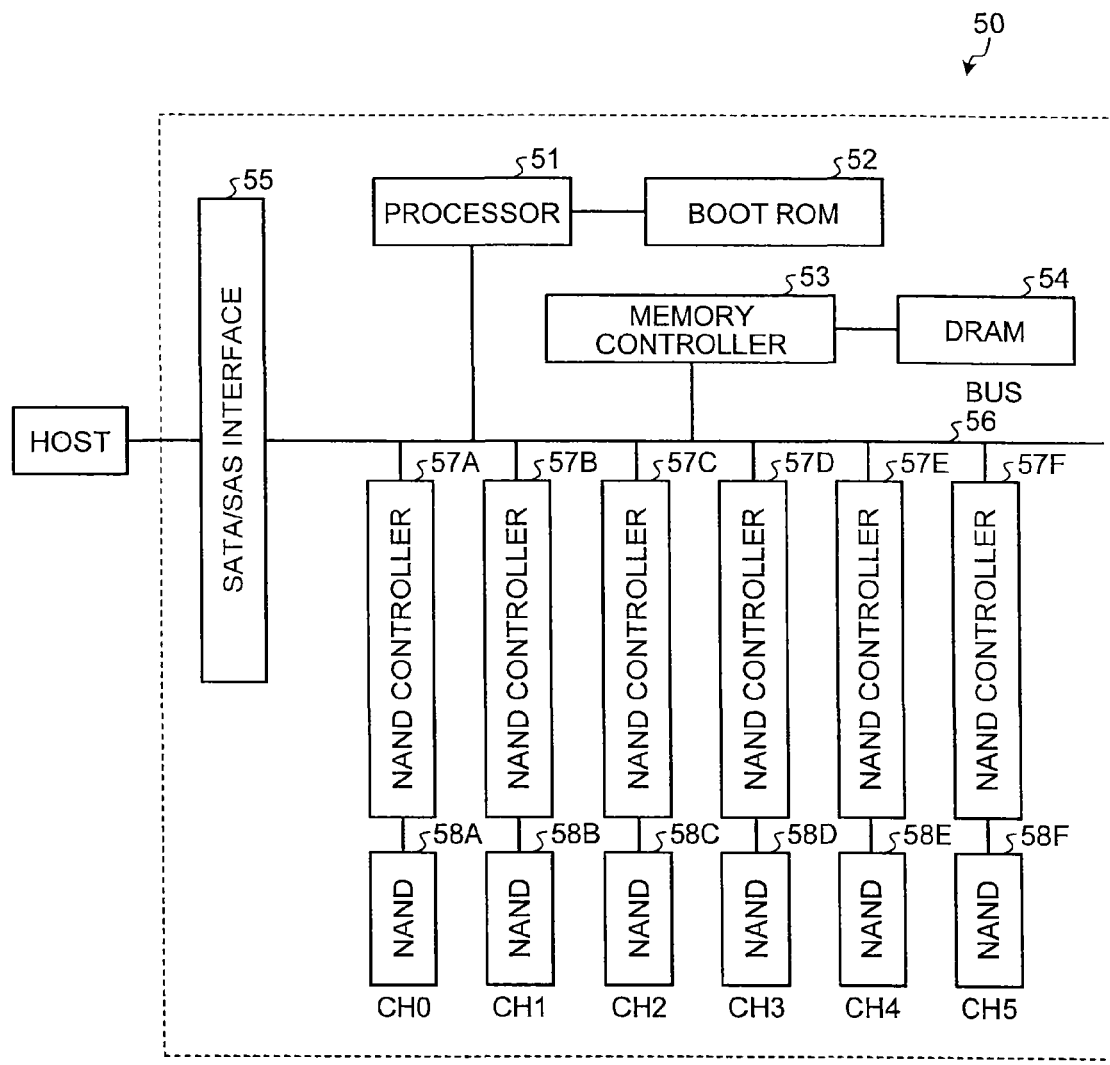
FIG. 1 is a diagram illustrating a hardware configuration of a semiconductor storage device 50 of an embodiment.

A hardware configuration of the semiconductor memory device according to the embodiment will be described with reference to FIG. 1. A semiconductor memory device 50 includes a processor 51, a boot Read Only Memory (ROM) 52, an SATA/SAS interface 55, a memory controller 53, a Dynamic Random Access Memory (DRAM) 54, NAND controllers 57A to 57F, a plurality of semiconductor memory elements (NAND) 58A to 58F, and a bus 56 connecting those components. In the case where it is unnecessary to distinguish the NAND controllers 57A to 57F from one another, they may be simply described as the NAND controllers 57. In the case where it is unnecessary to distinguish the semiconductor memory elements 58A to 58F from one another, they may be simply described as the semiconductor memory elements 58.

The SATA/SAS interface 55 controls communication with a host as a high-order apparatus of the semiconductor memory device 50 under control of the processor 51. The boot ROM 52 stores a program which is executed at the turn on the power source. Various system programs are stored in the semiconductor memory elements 58. The processor 51 reads the program from the boot ROM 52 at the turn-on of the power source, executes it, transfers the various system programs stored in the semiconductor memory elements 58 to the DRAM 54 in accordance with the program, and executes the system program on the DRAM 54, thereby controlling the entire semiconductor memory device 50 to realize various functions. Concretely, the processor 51 interprets a command sent from the host via the SATA/SAS interface 55 and, according to the command, controls writing of data to the semiconductor memory elements 58 and reading of data from the semiconductor memory elements 58.

The memory controller 53 controls the DRAM 54. The DRAM 54 stores various data and various programs. In the embodiment, the DRAM 54 stores a forward-lookup table and a bit vector table which will be described later. The NAND controllers 57 control the semiconductor memory elements 58 and include an error correction circuit.

The semiconductor memory element 58 corresponds to a semiconductor chip. For example, it is a memory element used in an NAND-type flash memory. Such semiconductor memory elements 58 cannot read/write at random but can perform reading/writing in unit called a page. A plurality of pages form a storage region in unit called a block. It is assumed here that one page is made of 4 KB, and one block is formed by 64 pages. Each of the semiconductor memory elements 58 is constituted by a plurality of blocks. In the embodiment, as shown in FIG. 1, the number of semiconductor memory elements 58 is six. Channels (CH0 to CH5) are allocated to the semiconductor memory elements 58A to 58F, respectively. The channel (CH5) among the channels is allocated as a channel in which redundant information is written, the other channels (CH0 to CH4) are allocated as channels in which data requested to be written by the host is written. The pages of the channels CH0 to CH5 are used as a set to constitute an error-correcting code. The channels CH0 to CH4 correspond to the semiconductor memory elements 58A to 58E, respectively, and the channel CH5 corresponds to the semiconductor memory element 58F. As will be described later, in the case where data requested to be written by the host is larger than the size of a page, the semiconductor memory device 50 divides the data into a plurality of pieces, and allocates and writes the data pieces divided in pages (referred to as divided pieces of data) to the respective channels CH0 to CH4. That is, in the basic configuration of the embodiment, the semiconductor memory device 50 writes a predetermined number of pieces of data requested to be written in a predetermined unit and redundant information that is calculated by using the pieces of data and is used for correcting an error of the pieces of the data into the different semiconductor memory elements 58, respectively, thereby constituting an error correction code by the pieces of data and the redundant information. As an error correction code, for example, a parity code is used.

Here, a write method for writing to the semiconductor memory elements 58 will be described. A NAND-type semiconductor memory element conventionally employs an Log-structured method. In the Log-structured method, a block needs to be erased before writing. Erasure of a block is to set all bits constituting the block to "1". The semiconductor memory device 50 performs such erasure in units of a block and performs writing in units of a page to the erased blocks. Accordingly, in the NAND-type semiconductor memory elements 58, data can be sequentially written to unwritten pages in an erased block, and written pages cannot be add pages. Writing of data in response to the request from the host is indicated by a logical block address used in the host. On the other hand, writing of data and redundant information to the semiconductor memory elements 58 is performed according to the physical block addresses of the semiconductor memory elements 58 in the ascending order of pages regardless of the logical block address. The association between the physical block address and the logical block address is stored in a forward lookup table described later. When writing of new data is requested by the host with the logical block address specified in the previous data request being specified again, the semiconductor memory device 50 writes the new data to an unwritten page of an erased block. In this case, the page to which writing corresponding to this logical block address is previously performed is set to be invalid and the page to which the new data is written is set to be valid. The semiconductor memory device 50 writes new data and redundant information while constructing the above-described error correction code.

Figure 2:
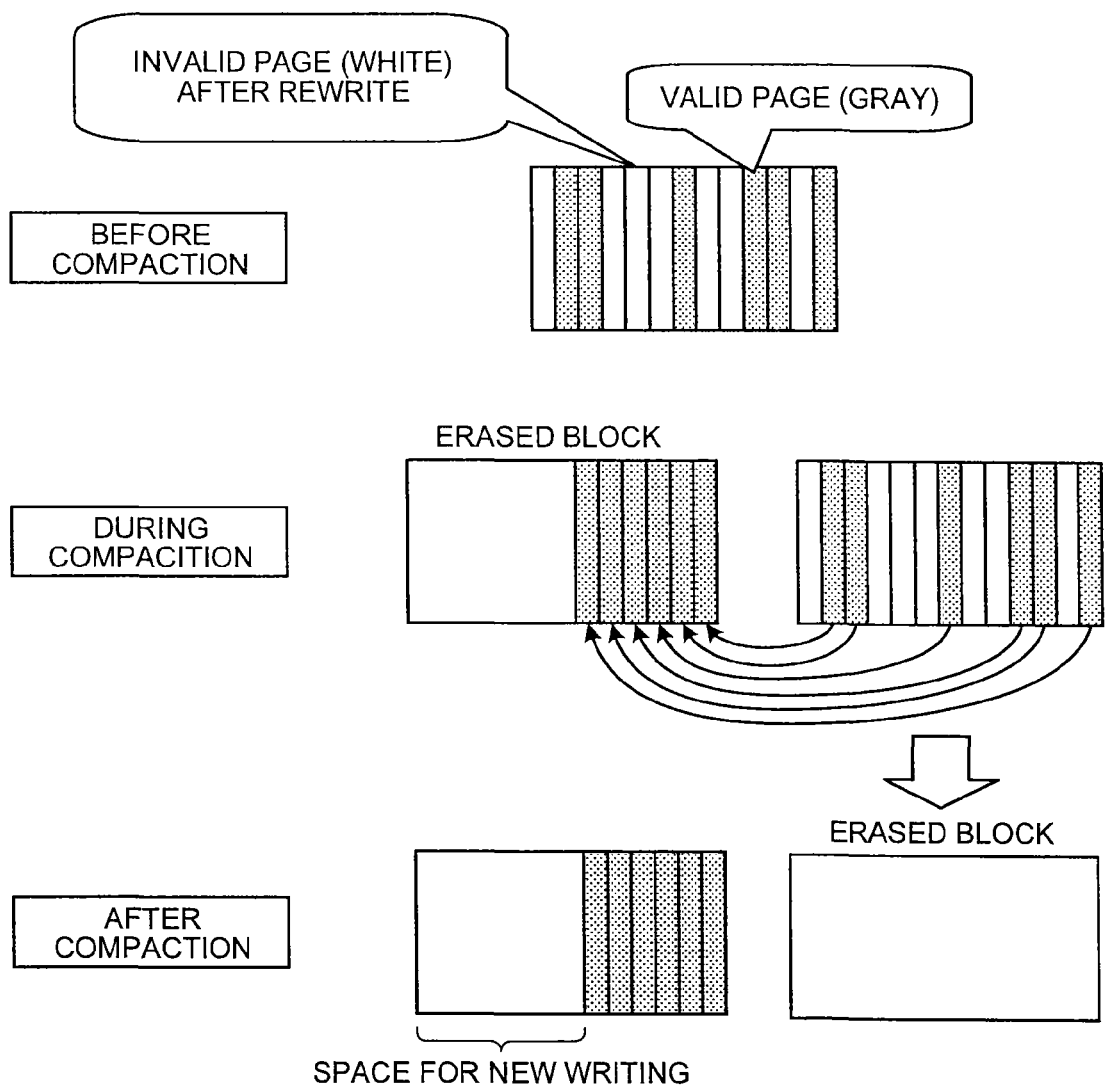
FIG. 2 is a conceptual diagram for explaining compaction.

In this Log-structured method, when the number of pages which are made invalid increases by continuing the writing, write realizable capacity (referred to as realizable capacity) in the semiconductor memory elements 58 becomes smaller. At the time point when the number of new erased blocks to which information can be written, that is, the number of blocks to which information is not written yet after erasure (referred to as free blocks), decreases and a set of blocks constituting an error correction code (referred to as a logical block) cannot be assured, a write impossible state occurs. To prevent it, in the semiconductor memory device 50, garbage collection is made at a proper timing. The garbage collection made in the semiconductor memory elements 58 will be particularly called compaction. FIG. 2 is a conceptual diagram for explaining compaction. The semiconductor memory device 50 collects data written in physical block addresses (referred to as valid data) being not made invalid in blocks containing the pages being made invalid, and newly rewrites the collected valid data in free blocks to move the valid data thereto. After that, the semiconductor memory device 50 erases the blocks, thereby generating a new free block. In the semiconductor memory device 50, blocks that were unwritable become writable again by performing such compaction, allowing free blocks to be reserved. That is, new free blocks are generated by performing the compaction. Further if there is an unwritten page in a block in which valid data is written as a result of moving data, data can be newly written to the remaining unwritten page.

At least one free block is needed to perform such compaction, which means that the capacity (referred to as implemented capacity) implemented in the NAND-type semiconductor memory element 58 is smaller than the capacity at which writing can be actually realized. In the embodiment, the difference between the implemented capacity and the realizable capacity is referred to as spare capacity. When the spare capacity is small, the semiconductor memory device 50 has to frequently carry out compaction, which has a great impact on performance thereof. Referring to FIG. 2, compaction on the block unit basis has been described. In the embodiment, the logical block is the basic unit, so that a free block is reserved for each channel to constitute a logical block, and the compaction is performed the logical block unit basis.

Next, functions implemented in the semiconductor memory device 50 will be described with reference to FIG. 3. The semiconductor memory device 50 includes a host interface unit 60, a buffer controller 61, an address translation unit 62, a CH allocating unit 63, a compaction candidate detector 64, a management table updating unit 65, NAND controllers 66A to 66F, a data buffer 67, a compaction read queue 68, and a management table 69. The function of the host interface unit 60 is realized by execution of the program by the processor 51 and the function of the SATA/SAS interface 55. The functions of the address translation unit 62, the CH allocating unit 63, the management table updating unit 65, the compaction candidate detector 64, and the buffer controller 61 are implemented when the processor 51 executes the program. The functions of the NAND controllers 66A to 66F correspond to the NAND controllers 57A to 57F, respectively and implemented by execution of the program by the processor 51 and the functions of the NAND controllers 57A to 57F corresponding to the NAND controllers 66A to 66F, respectively. The NAND controllers 66A to 66F correspond to the semiconductor memory elements 58A to 58F to which the channels CH0 to CH5 are allocated, respectively, in a one-to-one corresponding manner. In the case where it is unnecessary to distinguish the NAND controllers 66A to 66F from one another, they may be simply described as the NAND controllers 66. The data buffer 67, the compaction read queue 68, and the management table 69 are, for example, information stored on the DRAM 54.

The host interface unit 60 is an interface that controls communication between the host and the semiconductor memory device 50. The host interface unit 60 receives a command transmitted from the host. When the command requests writing of data with a specified logical block address, the host interface unit 60 transmits the command (referred to as write command) to the address translation unit 62 which will be described later. When the size of the data requested to be written is equal to or less than the page size, the host interface unit 60 transmits the data to the buffer controller 61, which will be described later. When the size of the data is larger than the page size, the host interface unit 60 divides the data into pieces of units of a page, and sends the data thus divided (referred to as divided pieces of data) to the buffer controller 61. This is because the translation between the logical block address and the physical block address is made in the page unit basis. For example, the host interface unit 60 divides data of 128 KB into 32 pieces of 4-KB data. The data or the divided pieces of data transmitted to the buffer controller 61 in response to the write command is referred to as write target data for convenience of description.

In the case where a command transmitted from the host requests reading of data with a specified logical block address, if the size of the data requested to be read is equal to or less than the page size, the host interface unit 60 sends the command (referred to as the read command) to the address translation unit 62. In the case where the size of data requested to be read is larger than the page size, the host interface unit 60 sends a command (read command) requesting reading of data on the page unit basis to the address converter 62. The host interface unit 60 calculates the logical block address of each of pieces of data to be read by using the logical block address specified by the command transmitted from the host, and sends the read command requesting to read data with the calculated logical block address to the address translation unit 62. The host interface unit 60 reads the data to be read which is stored in a designated region in the data buffer 67 by the buffer controller 61, which will be described later, and transmits it to the host.

Figure 4:
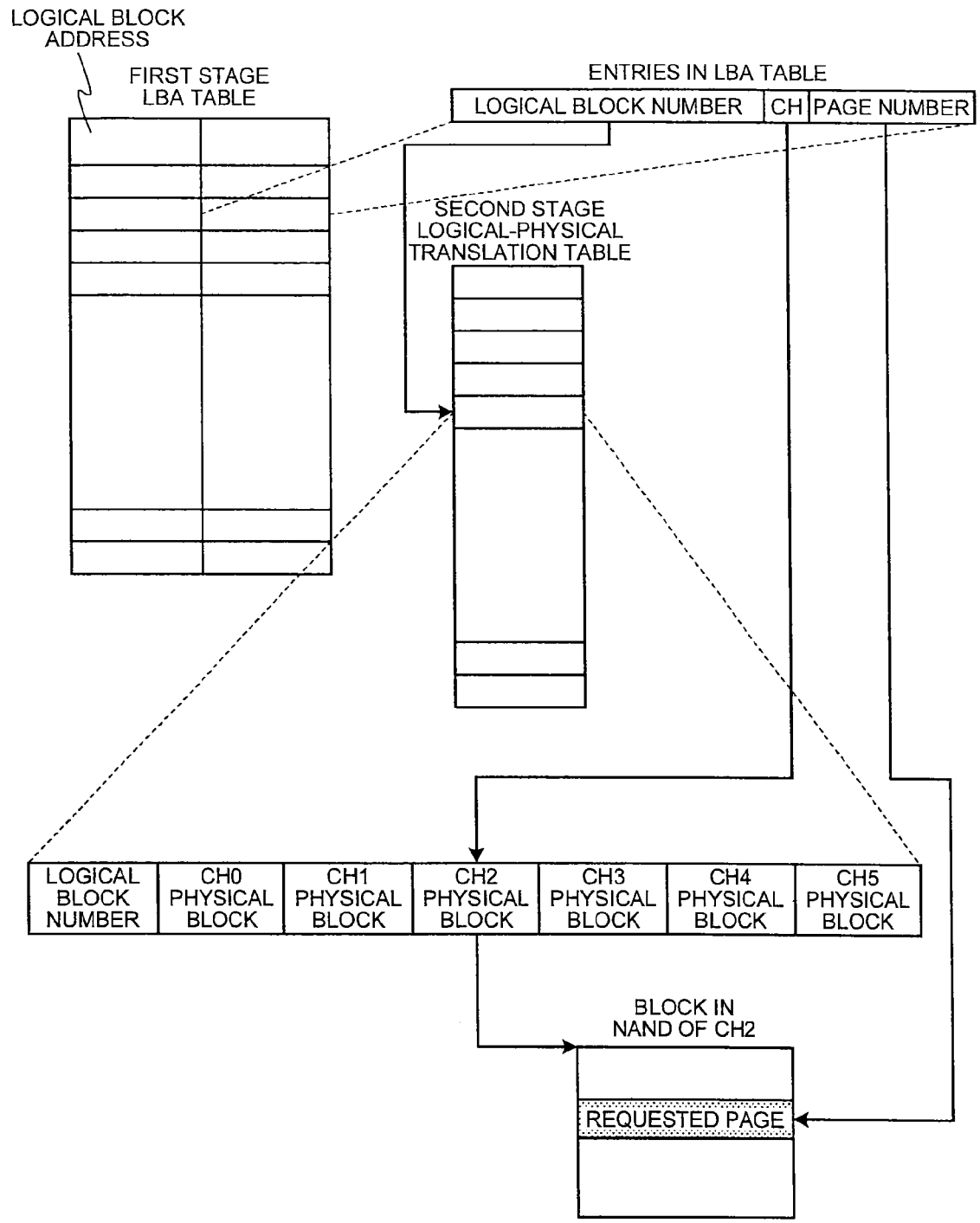
FIG. 4 is a diagram illustrating a data configuration of a forward-lookup table.

The management table 69 includes the forward-lookup table and the bit vector table. The forward-lookup table is stored therein identification information and region specifying information associated each other. The identification information is for associating data to be written and redundancy information, and the region specifying information specifies each of a plurality of storage regions in the semiconductor memory elements 58 in which the data to be written and the redundancy information associated with each other are written. The forward-lookup table indicates the association between the logical address of data to be written and the physical address indicative of a physical storage location in which the data to be written is stored in the semiconductor storage elements 58. Such a forward-lookup table is used at the time of specifying the physical address indicative of the location on the semiconductor storage element 58 in which data corresponding to the logical address specified by the host is stored. FIG. 4 is a diagram showing the data configuration of the forward-lookup table. As shown in FIG. 4, the forward-lookup table has an LBA table and a logical-to-physical conversion table. The LBA table includes the logical address as an index and entries including the channel number, the page number given to the page, and the logical block number given to a logical block in which the data is stored.

The logical block number is identification information that associates write target physical blocks and redundant information physical block with each other. The logical block number, which is a unique number, is given to each of the blocks in the sequence they were generated. The channel number are CH0 to CH4 in this embodiment, and indicates to which channel the semiconductor memory element 58 including the physical block in which data associated with the logical block address is stored is connected. The page number indicates which page of the physical block identified by the logical block number and the channel number the data associated with the logical block address is stored in. The page number may be given in the sequence of the physical block addresses, or the physical block address itself may be given as the page number, for example.

The logical-physical translation table is region specifying information specifying a plurality of storage regions in the semiconductor memory elements 58 in which write target data and redundant information are to be written, and stores therein the logical block number and the physical blocks of channels associated with the logical block so as to be corresponded to each other. The logical-to-physical translation table stores therein the logical block number as an index, addresses of physical blocks of the channels (physical block addresses) being associated with the logical block are stored. In such a configuration, using, as an index, the logical block number stored in entries in the LBA table corresponding to one logical block address, an entry in the logical-to-physical translation table relating to the logical block is specified with the index. Next, a physical block in the semiconductor memory element 58 connected to the channel of the channel number recorded in the entry in the LBA table is specified from among the physical blocks stored in the entries in the logical-to-physical translation table. The page in which the data corresponding to the logical block address is written is specified with the page number included in the entry in the LBA table.

As described above, the data required by the host to be written is stored in the channels CH0 to CH4 on the page unit basis, and redundant information that is to be added to constitute an error correction code is written in the channel CH5. Consequently, the redundant information is written in the storage region of the physical block address of the channel CH5 indicated by each of entries in the logical-to-physical translation table. Since the logical block address corresponding to the redundant information does not exist, an entry relating to the redundant information is not recorded in the LBA table. Information on redundant information is recorded in an entry in the logical-to-physical translation table. The forward-lookup table is updated each time write target data and redundant information are written in the semiconductor memory element 58. How the forward-lookup table is updated will be described later.

Figure 5:
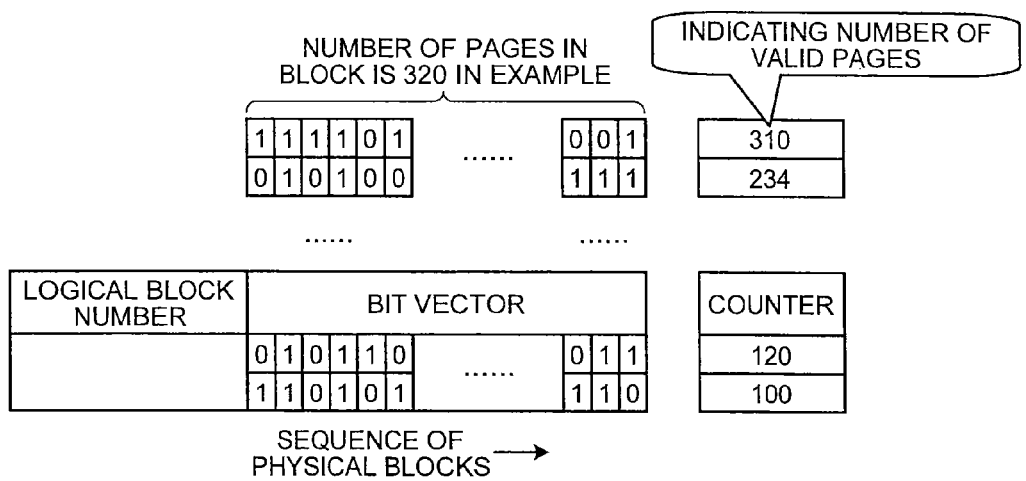
FIG. 5 is a diagram illustrating a data configuration of a bit vector table.

Next, the bit vector table will be described with reference to FIG. 5. The bit vector table is a table showing, in binary in the sequence of physical blocks, which pages in each of the physical blocks on each of the channels CH0 to CH4 out of the physical blocks associated with the logical block are pages (referred to as valid pages) to which valid data are written. The binary indication for each page is called a bit vector. If the value of the bit vector is "1", this means that the page is a valid page, and if the value of the bit vector is "0", this means that the page is not a valid page (invalid). In the initial state, the values of bit vectors are all set to "0".

In the embodiment, channels to which write target data is written are five channels CH0 to CH4 out of the physical blocks associated with the logical block, and if it is assumed that one physical block includes 64 pages, one logical block includes 320 pages. Consequently, the number of corresponding bit vectors is 320 per logical block. As shown in FIG. 5, the bit vector table includes, for each logical block, the above-described logical block number as the index thereof, the bit vector associated with each page included in each of the physical blocks of the channels CH0 to CH4 associated with the logical block to which the logical block number is given, and a counter. In the embodiment, the entries in the logical-to-physical translation table and the bit vector in the bit vector table are arranged in advance so that the index in the logical-to-physical translation table matches the index in the bit vector table match. In FIG. 5, the bit vectors are arranged in the sequence of the pages of each of the physical blocks of the channels CH0 to CH4 in such a manner that, from left, the first page, the second page, . . . , and the last page of the channel CH0, the first page, the second page, . . . , and the last page of the channel CH1, and the like. The counter represents the total number of bit vectors whose values are "1". Since a page whose corresponding bit vector has a value "1" is a valid page, the counter represents the number of valid pages in a logical block. In such a configuration, the bit vector table is updated each time the host requests writing of data. How the bit vector table is updated will be described later.

Figure 3:
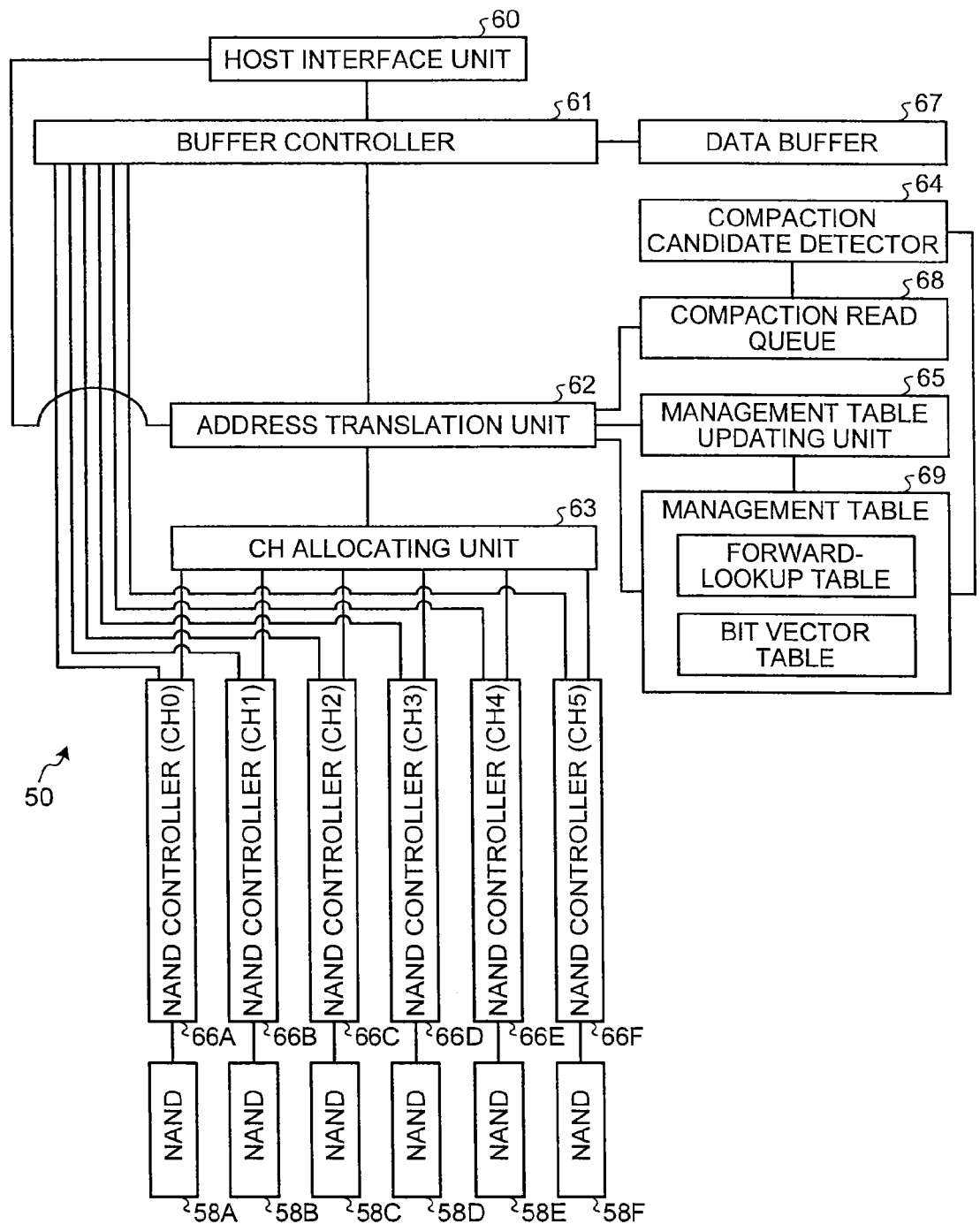
FIG. 3 is a diagram illustrating a functional configuration of the semiconductor storage device 50.

The description refers back to FIG. 3. The address translation unit 62 receives a command from the host interface unit 60. When the command is a read command, the address translation unit 62 refers to the forward-lookup table in the management table 69 using the logical block address specified by the read command, and determines a channel and a physical block address of a page in which data requested to be read by the read command is written. The address translation unit 62 specifies a channel and a physical block address and sends a command requesting to read data to the NAND controller 66 via the CH allocating unit 63. In contrast, when the command received from the host interface unit 60 is a write command, the address translation unit 62 sends the write command to the CH allocating unit 63 which will be described later.

In response to a compaction read command stored in the compaction read queue 68 which will be described later, the address translation unit 62 sends a command requesting to read data (valid data) in a valid page with a physical address specified by the compaction read command to the NAND controller 66 corresponding to the channel to which the semiconductor memory element 58 with the physical block including the valid page is connected, by referring to the forward-lookup table. The valid data is read from the semiconductor memory element 58 via the NAND controller 66 and stored in the data buffer 67 via the buffer controller 61. The address translation unit 62 sends the command requesting to write the valid data (referred to as compaction write command) to the CH assigning unit 63.

The CH allocating unit 63 receives the command from the address translation unit 62, and when the command is a write command, determines the channel to which write target data is to be written. For example, the CH allocating unit 63 performs writing operation in round-robin manner in 4 KB in channels other than the channel to which redundant information is written (in this case, the channel CH5) and determines the channel to which data is written in accordance with the order of round robin. Then, the CH allocating unit 63 sends the command requesting to write the write target data to the NAND controller 66 corresponding to the determined channel. In contrast, in the case where reading of data is requested with a specified channel and a specified physical block address by a command from the address translation unit 62, a command requesting to read data with the specified physical block address is transmitted to the NAND controller 66 corresponding to the designated channel. In the case where a command received from the address translation unit 62 is a compaction write command, the CH allocating unit 63 determines a channel to which data is to be written in accordance with the order of round robin and sends a command requesting to write valid data to the NAND controller 66 corresponding to the determined channel.

The NAND controller 66 receives the command from the CH allocating unit 63 and accesses the corresponding semiconductor memory element 58 according to the command. Concretely, when the command requests to write data, the NAND controller 66 obtains write target data via the buffer controller 61 and writes the write target data to the semiconductor memory element 58. In the writing, the NAND controller 66 sets a write pointer to sequentially point a writing location, page by page, out of unwritten page in an erased block of the corresponding semiconductor memory element 58, writes the write target data to a page at a location pointed by the write pointer, and then updates the write pointer to point a location of an unwritten page which is the next page subsequent to the page subjected to the writing. Therefore, the value of the write pointer changes to sequentially point the next write location. For example, when a block is identified by a physical block address of 15 bits in each channel and the block includes 64 pages, the write pointer has 15+6=21 bits in total.

Figure 6:
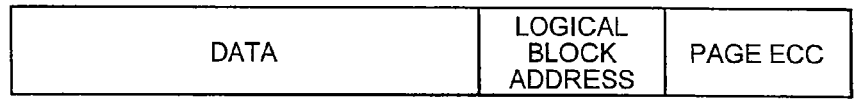
FIG. 6 is a diagram illustrating data to be written.

Here, the data configuration of write target data and redundant information will now be described. The NAND controller 66 adds an error correction code (referred to as page ECC) for detecting and correcting an error of the write target data itself and a logical block address specified by a write command to the write target data. It is assumed that the page ECC includes codes such as a CRC code for detecting an error in data and an ECC code to correct the data error. The reason why the page ECC also includes a CRC code is that there is the possibility of miss-correction when the data is corrected to the wrong data. FIG. 6 is a diagram illustrating write target data to which redundant information is added. In the semiconductor memory elements 58 of the channels determined as described above, the NAND controller 66 writes the write target data to which such a page ECC and the logical block address are added to a page pointed by the write pointer in the semiconductor memory element 58 in each channel determined as described above. The write target data has a size in a unit of pages. It is assumed that the page size of the semiconductor memory element 58 equals the size of the entire data including the write target data and the added page ECC and logical block address. The logical block address of each of divided pieces of data is calculated by each NAND controller 66 on the basis of the logical block address specified by the write command. In contrast, the NAND controller 66F corresponding to the channel CH5 to which redundant information calculated so as to constitute the error correction code is written adds the page ECC for detecting and correcting an error of redundant information itself to the redundant information. The NAND controller 66F writes the redundant information to which the page ECC is added into the page in the semiconductor memory element 58F pointed by the write pointer.

Figure 7:
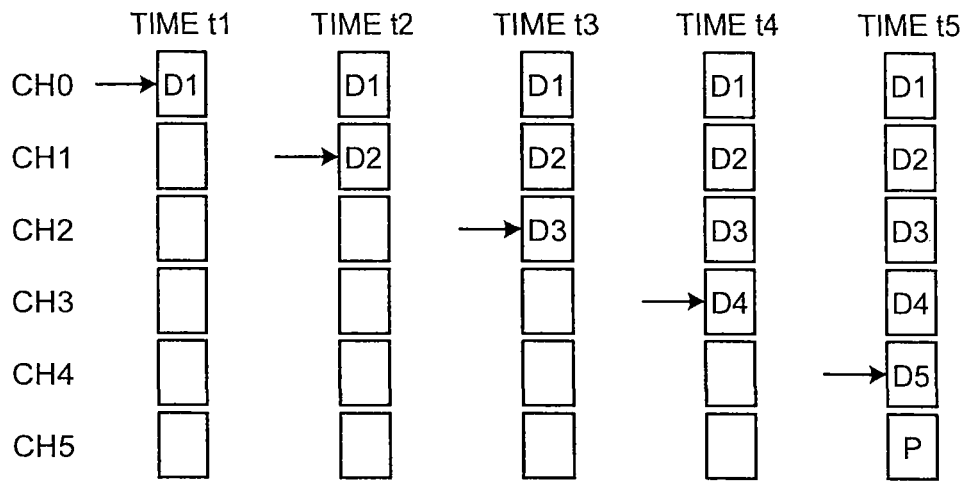
FIG. 7 is a diagram for explaining writing operation performed by round-robin manner.

Next, writing of a plurality of divided pieces of data as write target data to the channels CH0 to CH5 by round-robin processing will be described. FIG. 7 is a diagram for explaining writing performed by the round-robin processing. For simplification of the diagram, the logical block addresses added to the divided pieces of data are not shown. As shown in the diagram, the divided pieces of data is written sequentially in the round-robin manner from the channel CH0 to the channel CH4 in a manner such that first divided data D1 is written to the channel CH0 at time T1 and the next divided data D2 is written to the channel CH1 at time T2. When divided data D5 is written in the channel CH4 at time T5, parity P of the divided data D1 written in the channel CH0 at time T1, the divided data D2 written in the channel CH1 at time T2, the divided data D3 written in the channel CH2 at time T3, the divided data D4 written in the channel CH3 at time T4, and parity P of the divided data D5 written in the channel CH4 at time T5 is calculated as redundant information, and the redundant information P is written in the channel CH5. At the time of further writing of divided pieces of data, the data is written sequentially in the round-robin manner from the channel CH0. By writing the divided pieces of data in the round-robin manner, writing operation of the channels are uniformly performed. In the example of the diagram, a state where data is written in order of the channels with lapse of time is shown. However, the invention is not limited to the example. Data may be written simultaneously to two or more channels.

Figure 8:
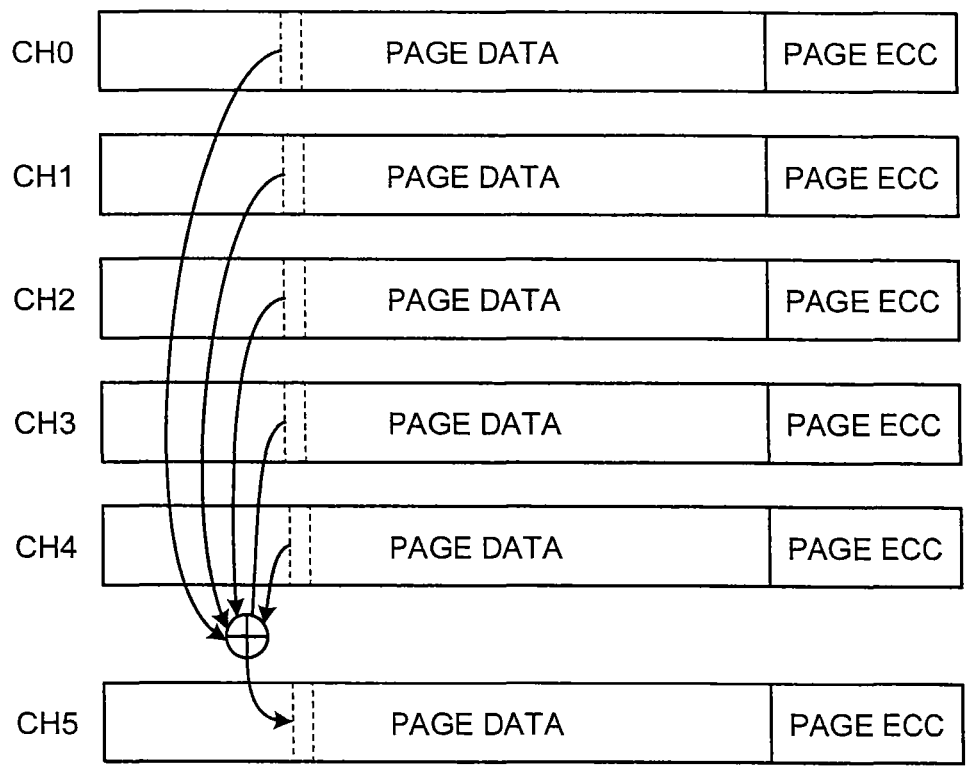
FIG. 8 is a diagram for explaining the configuration of an error correcting code.

Next, the configuration of the error correction code will be described with reference to FIG. 8. For convenience of explanation, in the diagram, the logical block addresses added to the divided pieces of data to be written in each of the channels CH0 to CH4 are not shown. As shown in FIG. 8, the NAND controller 66F corresponding to the channel CH5 calculates the exclusive OR in bytes at the same offset location in pieces of data written in the channels CH0 to CH4, and writes the value thus calculated as redundant information in the same offset location in the semiconductor memory element 58F of the channel CH5. That is, an error correction code is constituted by the bytes at the same offset location in the channels CH0 to CH5.

The description refers back to FIG. 3. When the command received from the CH allocating unit 63 requests to read data with a specified physical block address, the NAND controller 66 reads data from a location corresponding to the physical block address in the semiconductor memory element 58 using the physical block address, and sends the read data to the buffer controller 61. If there is an error in the data read from the semiconductor memory element 58, the NAND controller 66 detects the error and corrects it. A method of detecting and correcting an error in data will be described later. When the command received from the address translation unit 62 requests to read data (valid data) in a valid page with a specified physical block address, the NAND controller 66 reads data written in a page corresponding to the physical block address in the semiconductor memory element 58 by using the physical block address, and stores the read data in the data buffer 67. When the command received from the CH allocating unit 63 requests to write valid data, the NAND controller 66 retrieves write target valid data via the buffer controller 61 and writes the valid data to the semiconductor memory element 58.

The compaction candidate detector 64 refers to the bit vector table included in the management table 69, determines a logical block to be a candidate for compaction, and sends a command (referred to as compaction read command) specifying the physical block address of a valid page in the logical block and requesting to read the valid page to the compaction read queue 68.

The data buffer 67 is a buffer for storing the write target data. The compaction read queue 68 is a first-in first-out buffer that stores a command requesting to read a valid page for compaction.

The buffer controller 61 manages the data buffer 67 as a plurality of regions and manages the regions in which data corresponding to the command are stored. Concretely, the buffer controller 61 stores write target data sent from the host interface unit 60 in response to a write command into the data buffer 67, and sends the write target data to the NAND controller 66 corresponding to the channel determined to be written by the CH allocating unit 63. The write target data is written in the semiconductor memory element 58 via the NAND controller 66. The buffer controller 61 stores the data sent from the NAND controller 66 into a specified region in the data buffer 67 in response to the read command, and then sends the data to the host interface unit 60. The data is transmitted to the host via the host interface unit 60. In response to the compaction read command, the buffer controller 61 stores data read from the semiconductor memory element 58 via the NAND controller 66 into the data buffer 67.

In the case where a command (write command) requesting to write data with a specified logical block address is received from a host, the management table updating unit 65 refers to the forward-lookup table, updates the bit vector table, and further updates the forward-lookup table. Concretely, the management table updating unit 65 first refers to the forward-lookup table to look up the physical block address corresponding to the logical block address. Namely, the management table updating unit 64 looks up which page of the physical block the data associated with the logical address has been written in. If the physical block address associated with the logical block address is not stored in the forward-lookup table, writing of data associated with the logical block address has not been performed. In this case, the management table updating unit 65 sets the value of the bit vector corresponding to the page to which the write target data associated with the logical block address is written in the bit vector table to "1".

The page to which the write target data is written is pointed by the write pointer. The management table updating unit 65 increments the value of a counter of the number of valid pages in the logical block associated with the physical block including the page by 1.

In contrast, if the physical block address associated with the logical block address exists in the forward-lookup table when the management table updating unit 65 refers to the forward-lookup table, writing of the data associated with the logical block address has been performed before. In this case, it is necessary to invalidate the data written before due to the write command for the present writing. For this purpose, the management table updating unit 65 sets the value of the bit vector corresponding to the page at the physical block address stored in the entries of the forward-lookup table referred to for the logical block address specified by the write command to "0". In addition, the management table updating unit 65 decrements by 1 the value of a counter which indicates the number of valid pages in the logical block with the physical block that includes the page. The management table updating unit 65 sets the value of the bit vector corresponding to the page to which the write target data is to be written to "1", and increments by 1 the value of a counter of the number of valid pages in a logical block associated with the physical block that includes the page. By performing updating each time writing of data is performed, the bit vector table and the counter of the number of valid pages always indicate the locations of valid pages and the number thereof. Finally, the management table updating unit 65 records the physical block address to which write target data is written in an entry corresponding to the logical block address in the forward-lookup table.

Next, procedures of processes performed by the semiconductor memory device 50 according to the embodiment will be described. First, procedures of writing the write target data in the semiconductor memory element 58 by the semiconductor memory device 50 in response to a write command from a host will be described with reference to FIG. 9. Before starting the writing, the semiconductor memory device 50 reserves free blocks for channels in advance. When a write command requesting to write data with a specified logical block address is received from the host (step S1), the semiconductor memory device 50 selects one free block in each of the channels and constitutes a logical block by associating the free blocks of the channels CH0 to CH5. When a write command requesting to write data with a specified logical block address is received from the host and there is no unwritten page left in the ongoing logical block, the semiconductor memory device 50 may secure the free block. When there is any unwritten pages left in the ongoing logical block, the semiconductor memory device 50 does not secure the free block and writes the data into the unwritten page in the logical block. The semiconductor memory device 50 gives a logical block number to the logical block and records the logical block number as an index and the respective physical block addresses, which are associated with the logical block, of the physical blocks in the channels into a logical-to-physical translation table. At this time, the semiconductor memory device 50 arranges the sorting order of logical-to-physical translation table entries, the sorting order of the physical block addresses of the physical blocks in the channels in the logical-to-physical translation table entries, and bit vectors in a bit vector table so that a bit vector of each physical block associated with the logical block can be referred to by using the index in the logical-to-physical translation table. The semiconductor memory device 50 sets, for each channel, the write pointer indicative of a page of each physical block to which data is to be written, together with the physical block address, which is associated with the logical block, in each physical block. Before starting writing, the semiconductor memory device 50 sets the write pointer of each channel so as to point the first page of the physical block at the head of the channel.

The semiconductor memory device 50 determines whether the size of data requested to be written by the write command is equal to or less than the page size or not (step S2). In the case where the page size is equal to or less than the size of a page (YES in step S2), the semiconductor memory device 50 stores the data (write target data) in the data buffer 67 (step S4). In contrast, in the case where the size of data requested to be written by the write command is larger than the page size (NO in step S2), the semiconductor memory device 50 divides the data into pieces in units of a page (step S3) and records the divided pieces of data (write target data) into the data buffer 67 (step S4).

The semiconductor memory device 50 refers to the forward-lookup table on the basis of a logical block address specified by the write command and, when a physical block address corresponding to the logical block address of the write target data has been already recorded therein, the semiconductor memory device 50 stores the physical block address as an old physical block address in the DRAM 54, for example (step S5). The semiconductor memory device 50 determines channels to which the write target data is to be written in round-robin manner (step S6) and writes the write target data with a page ECC and the logical block address added thereto to a page pointed by the write pointer in the semiconductor memory element 58 of the determined channel (step S7). Then, the semiconductor memory device 50 updates the write pointer of each channel to point a next unwritten page following the page to which the write target data is written (step S8).

Figure 10:
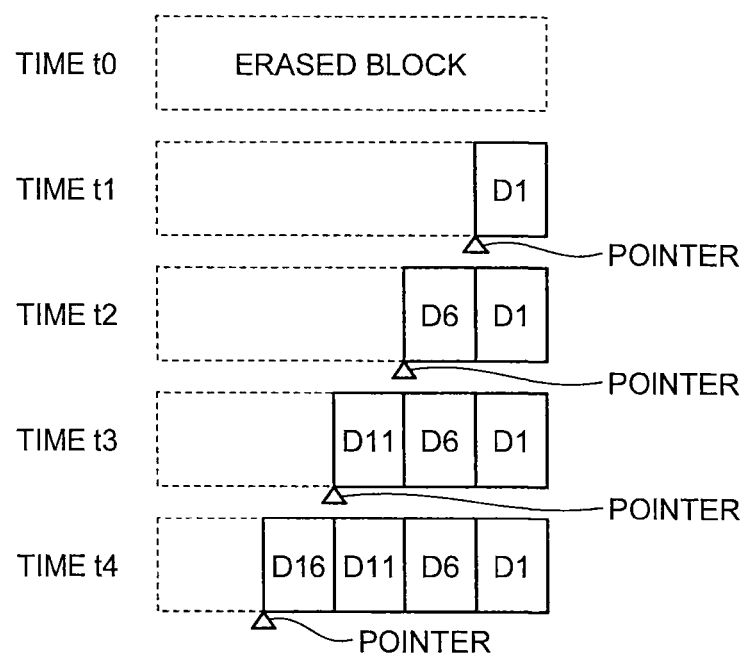
FIG. 10 is a diagram illustrating a state where data to be written is written with lapse of time.

FIG. 10 is a diagram showing a state where the divided pieces of data is written as write target data in the channel CH0 with lapse of time. First, at time t0, a free block is reserved. At time t1, first divided data D1 is written in the first page (at the head or at the end) in the free block reserved at time t0. At time t2, newly-determined divided data D6 is written in the second page in the channel CH0 in the round-robin manner. Similarly, at time t3, divided data D11 is written in the third page. At time t4, divided data D16 is written in the fourth page. In such a manner, pages to which divided pieces of data are written are determined in ascending order in the physical block regardless of the logical block address. The write pointer is set each time writing is performed so as to point a page to which data is written in the ascending order. In the embodiment, writing operations to the channels are performed uniformly in the round-robin manner, so that the difference between the page numbers pointed by the write pointer in each channel is 1 at the maximum. When the writing is finished on the final page in the logical block, the page numbers pointed by the write pointers in the channels are the same.

As described above, regardless of the value of a logical block address specified by a write command from a host, the physical block addresses of pages to which write target data are allocated in a ascending order, and data is written in the pages.

Figure 9:
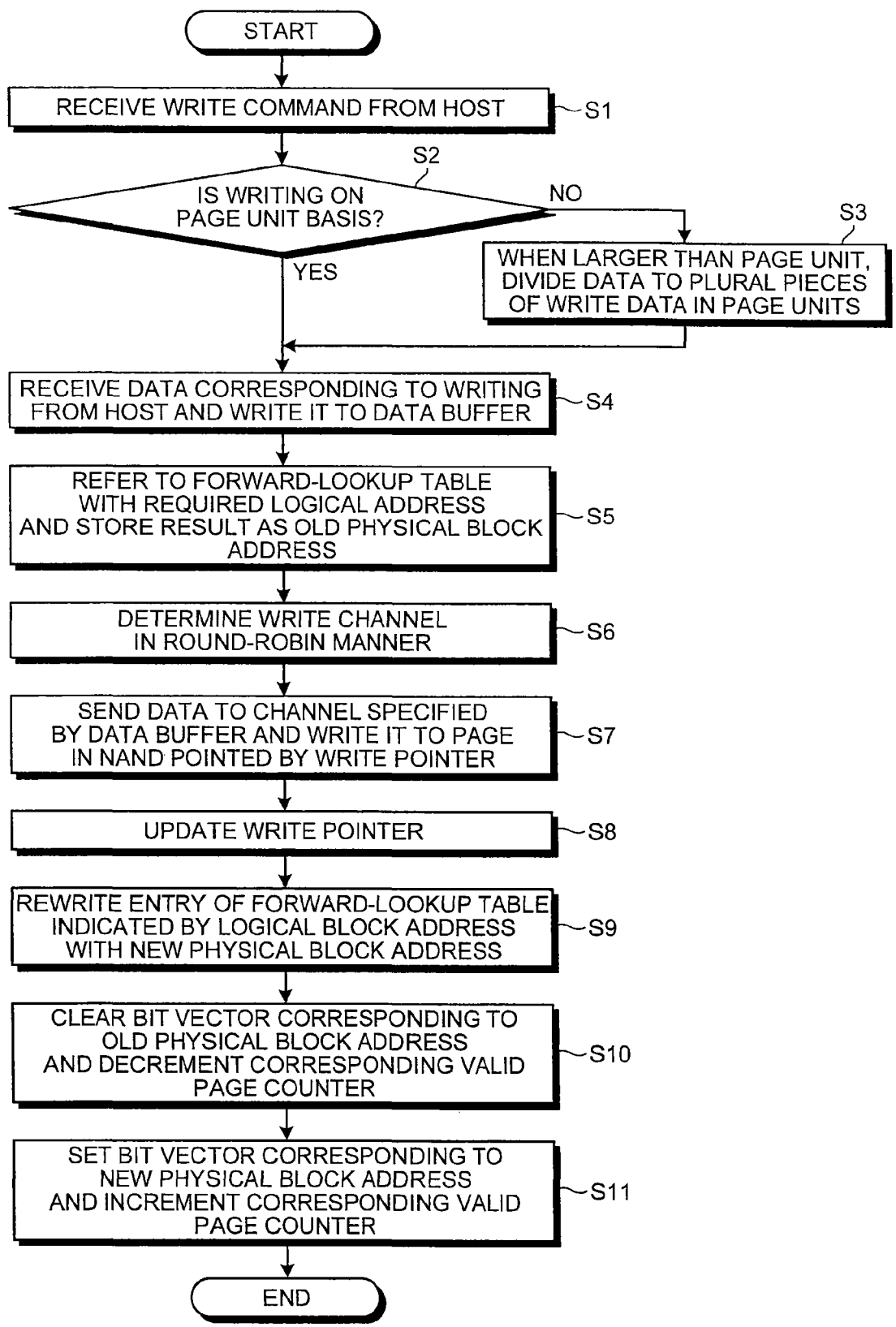
FIG. 9 is a flowchart showing a procedure of writing data to be written.

The description refers back to FIG. 9. As write target data is written, the semiconductor memory device 50 records the association between the logical block address of write target data and the physical block address of the page to which the write target data is written into the forward-lookup table illustrated in FIG. 4 (step S9). If the write target data is divided pieces of data, the semiconductor memory device 50 calculates each of the physical block addresses of the divided pieces of data on the basis of the logical block address specified by the write command. Since the divided pieces of data are in units of a page, the semiconductor memory device 50 calculates values obtained by sequentially adding the page size (4 KB) to the specified logical block address as the logical block addresses of the divided pieces of data. Then, the semiconductor memory device 50 records the logical block address, the logical block number of the logical block associated with the physical block of each of channels to which the write target data is written is associated, and the channel number and page number indicating the channel and page to which the write target data is written in the current process into the LBA table. In the above-described example, the page number is indicated by lower six bits of the write pointer before updating, so that the value may be used as the page number. Each time writing of write target data is performed, the semiconductor memory device 50 updates the forward-lookup table as described above.

Further, the semiconductor memory device 50 refers to the bit vector table, sets the value of the bit vector corresponding to the page of the old physical block address stored in the DRAM 54 in step S5 to "0", and decrements the value of the counter of the number of valid pages of the logical block associated with the physical block that includes the page by 1 (step S10). The old physical block address indicates a page to which data was previously written in association with the logical block address specified by the write command received in step S10. Further, the semiconductor memory device 50 sets the value of the bit vector corresponding to the page to which the write target data is written in step S7 to "1", and increments the value of the counter of the number of valid pages of the logical block that includes the page by 1 (step S11). In such a manner, the semiconductor memory device 50 updates the bit vector table as the write target data is written.

In step S7, after writing of the write target data to the channels CH0 to CH4 is finished, the semiconductor memory device 50 calculates the exclusive OR in bytes at the same offset location in the write target data in the channels CH0 to CH4 and writes this value in the same offset location in the channel CH5, thereby writing redundant information. Alternatively, the semiconductor memory device 50 may start calculating the exclusive OR while writing the write target data to the channels CH0 to CH4.

In the case where the write pointer reaches the end of the block in all of the channels (CH0 to CH5) and data becomes unable to be newly written in the logical block, the semiconductor memory device 50 constructs a new logical block. A method of constructing a logical block is as described above. A method of writing divided pieces of data and redundant information to the new logical block is also as described above.

Figure 11:
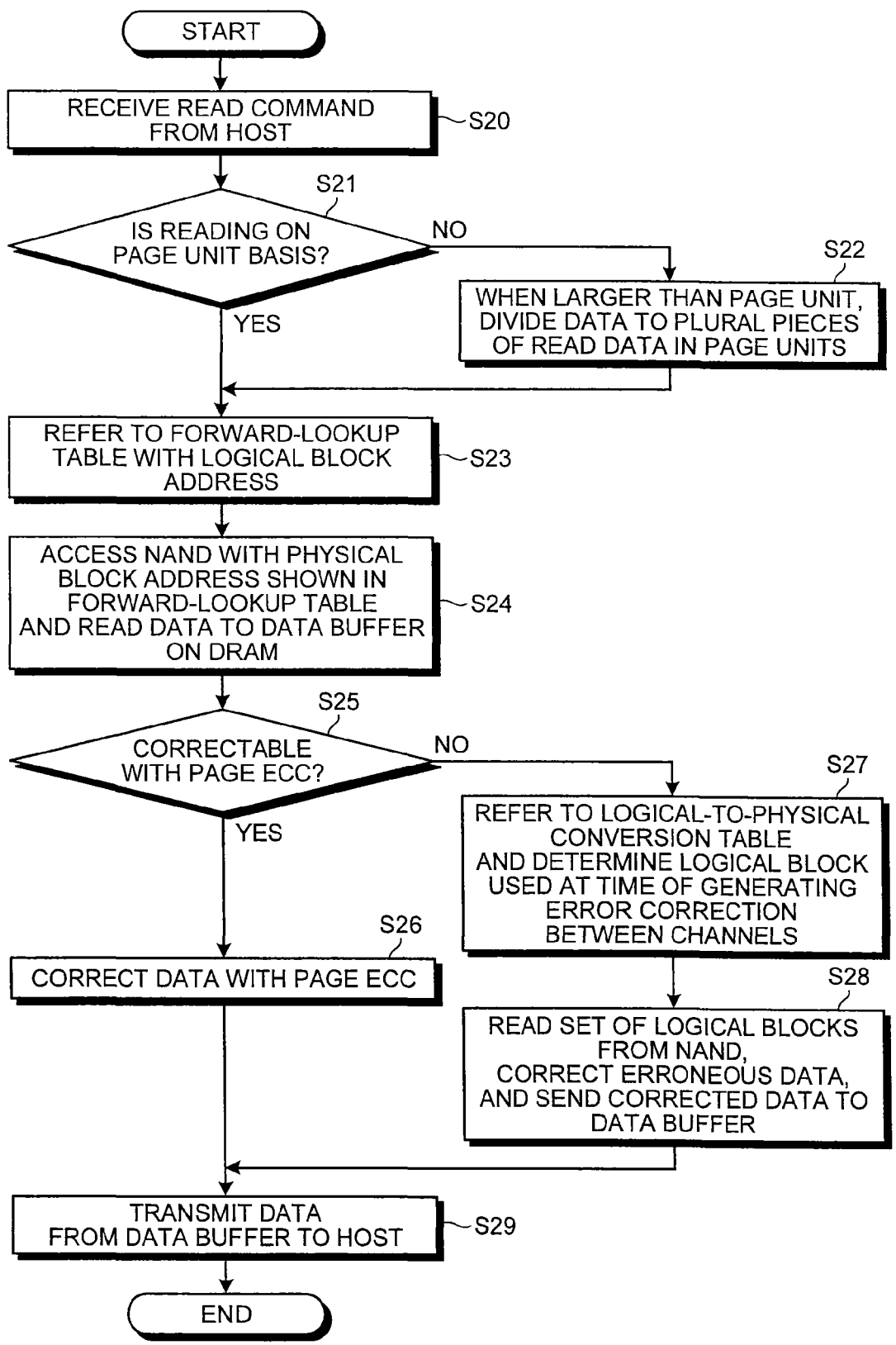
FIG. 11 is a flowchart showing a procedure of reading data.

Next, procedures of reading data from the semiconductor memory element 58 by the semiconductor memory device 50 in accordance with a read command from a host will be described with reference to FIG. 11. When a read command requesting to read data with a specified logical block address is received from the host (step S20), the semiconductor memory device 50 determines whether the size of data requested to be read by the read command is equal to or less than the page size (step S21). In the case where the size of the data is equal to or less than the page size (YES in step S21), the semiconductor memory device 50 refers to the LBA table of the forward-lookup table by using the logical block address specified by the read command and determines the logical block number. Next, the semiconductor memory device 50 refers to a logical-to-physical translation table by using the determined logical block number and determines a channel, a physical block and a page from which the data is to be read (step S23). The semiconductor memory device 50 reads the data from the semiconductor memory element 58 corresponding to the determined channel (step S24).

In contrast, in the case where the size of data requested to be read by the read command is larger than the page size (NO in step S21), the semiconductor memory device 50 divides reading so that data to be read becomes pieces of data in page units. That is, the semiconductor memory device 50 calculates each of the logical block addresses of the pieces of data to be read by using the logical block address specified by the read command (step S22). The semiconductor memory device 50 refers to the LBA table of the forward-lookup table and determines each of the logical block numbers using each of the calculated logical block addresses. Next, the semiconductor memory device 50 refers to the logical-to-physical translation table and determines each of the channels, the physical blocks, and the page from which the data is to be read (step S23) using each of the determined logical block numbers. The semiconductor memory device 50 reads the pieces of data from the semiconductor memory elements 58 corresponding to the determined channels (step S24).

Validity of the data read in step S24 is ensured by a page ECC added to the data. That is, the semiconductor memory device 50 detects an error in the data and can correct it by using the page ECC added to the read data. However, when there may be an error that cannot be corrected with the page ECC or miss-corrected with the page ECC, there is the possibility that a failure occurs in the semiconductor memory element 58 and abnormality occurs in data. In such a case (NO in step S25), the semiconductor memory device 50 refers to the forward-lookup table, determines a logical block associated with the physical block of the channel from which the data has been read using the logical block address used in reading of data (step S27), reads other pieces of data and redundant information written in the physical blocks of other channels associated with the determined logical block, and restores the data including the uncorrectable error by using the other pieces of data and the redundant information.

Figure 12:
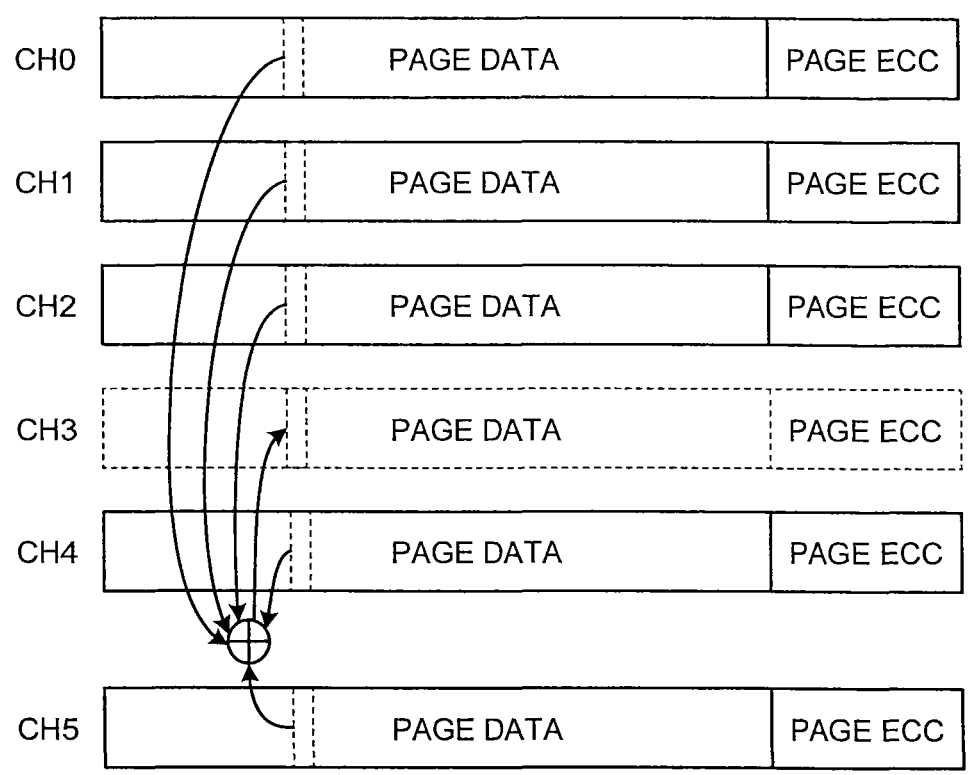
FIG. 12 is a diagram showing a state where data in which abnormality occurs is restored.

FIG. 12 is a diagram showing a state of restoring data which becomes abnormal due to a failure which occurs in the semiconductor memory element 58 of the channel CH3 as an example. Concretely, the semiconductor memory device 50 reads the other pieces of data and redundant information (pieces of data written in the channels CH0, CH1, CH2, and CH4 and redundant information written in the channel CH5) written in the physical blocks of channels other than the physical block associated with the logical block determined in step S27 and the physical block from which the erroneous data which cannot be corrected is read. The semiconductor memory device 50 restores the data in the channel CH3 by obtaining the exclusive OR at the same offset in the other pieces of data and the redundant information, that is, the exclusive OR in bytes at the same offset location. The semiconductor memory device 50 stores the restored data in the data buffer 67 (step S28) and advances to step S29.

Since there is a high possibility that abnormality occurs in a page from which erroneous data is read, the semiconductor memory device 50 newly writes the restored data to a different page. The semiconductor memory device 50 updates the bit vector table and the forward-lookup table by using the logical block address used in reading of data. The method of updating the tables is as described above. As a result of the updating, the bit vector of the page from which erroneous data is read is updated to "0", the bit vector of the page in which the restored data is written is updated to "1", and the physical block address of the page in which the restored data is written is recorded in a entry of the forward-lookup table for the logical block address specified by the read command.

In the case where there is no error in the data read in step S24, the semiconductor memory device 50 stores the data in a specified region in the data buffer 67 and advances to step S29. Even if there is an error in data read in step S24, the semiconductor memory device 50 corrects the data with the page ECC (step S26), stores the corrected data in a specified region in the data buffer 67, and advances to step S29. In step S29, the semiconductor memory device 50 transmits the data stored in the designated region in the data buffer 67 to the host.

When reading of a plurality of pieces of data is requested by a read command received in step S20, the semiconductor memory device 50 may read data from physical blocks of channels associated with different logical blocks in accordance with logical block addresses specified by the command. Since the channels can be independently accessed at the time of reading data as described above, the data can be read in response to a request from the host and transmitted to the host with high responsibility.

Figure 13:
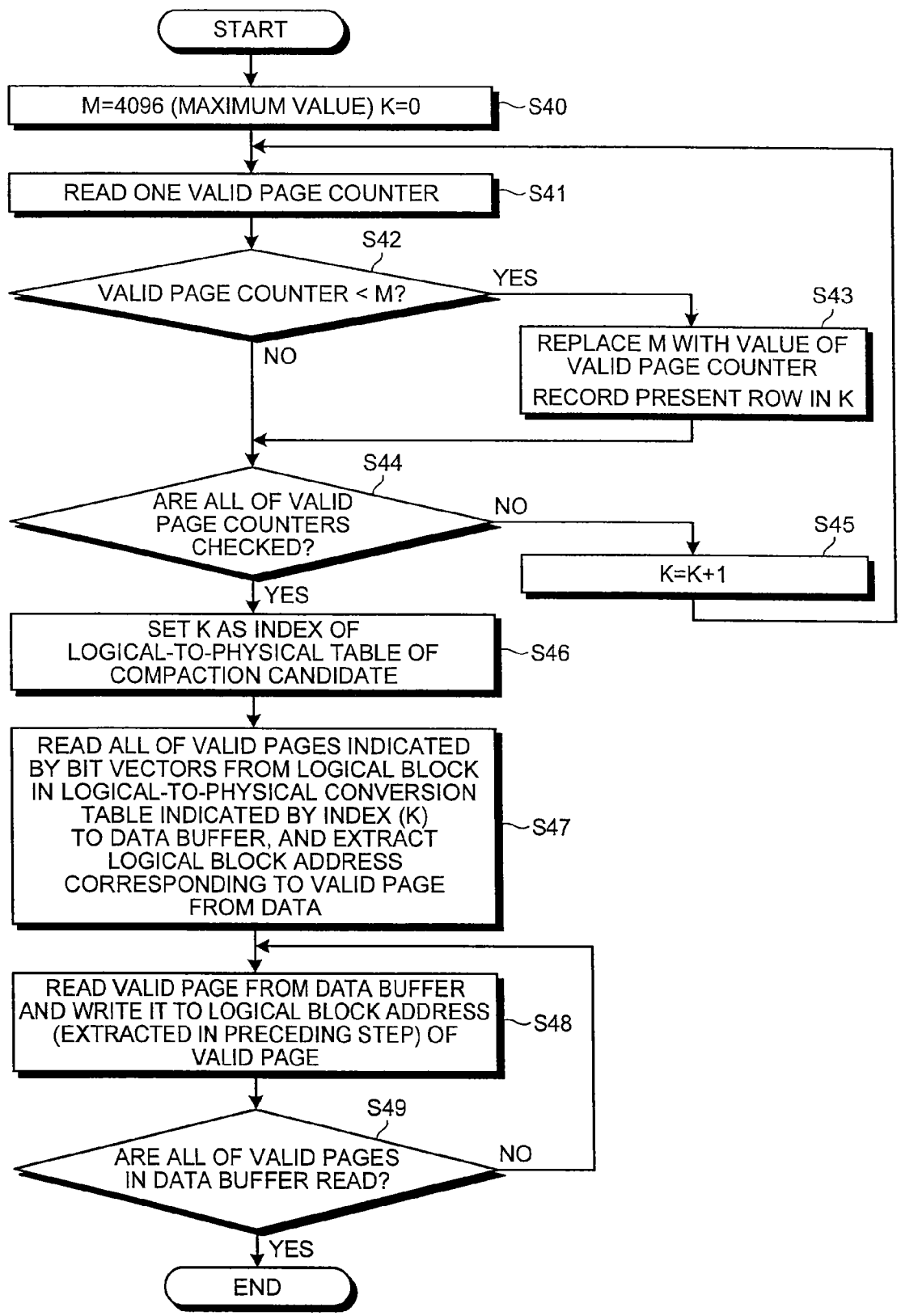
FIG. 13 is a flowchart showing a procedure of compaction process.

Next, procedures of moving valid data written in a logical block to be subjected to compaction to a free block will be described with reference to FIG. 13. The semiconductor memory device 50 sets "M=4096" as the maximum value of the number of valid pages, and sets "K=0" as an index of an entry of each logical block in a bit vector table (step S40). The semiconductor memory device 50 sequentially reads the value of the counter of the number of valid pages for each logical block one by one by referring to the bit vector table (step S41) and determines whether the value of the counter is smaller than M or not (step S42). In the case where the value of the counter of the number of valid pages is equal to or larger than M (NO in step S42), the device advances to step S44. In the case where the value of the counter of the number of valid pages is smaller than M (YES in step S42), the semiconductor memory device 50 replaces the value of M with the value of the counter and in step S41, sets the value of the index of the entry with which the value of the counter of the number of valid pages is read as K (step S43), and advances to step S44.

In step S44, the semiconductor memory device 50 determines whether or not the value of the counter of the number of valid pages has been read with respect to all of the logical blocks in the bit vector table. In the case where the value of the counter of the number of valid pages is read with respect to all of the logical blocks (NO in step S44), the semiconductor memory device 50 increments the value of K by 1 (step S45) and returns to step S41. In step S41, the semiconductor memory device 50 reads the value of the counter of the number of valid pages in the logical blocks which are not read yet in the order of K in the bit vector table. In contrast, in the case where the value of the counter of the number of valid pages has been read with respect to all of the logical blocks (YES in step S44), the semiconductor memory device 50 sets the value of K as the index of a logical block as a candidate to be subjected to compaction in the logical-to-physical translation table (step S46). As described above, since the entries are arranged so that the bit vector table can be referred to using the index of the logical-to-physical translation table, the index K of the entry in the bit vector table can be used as the index of the entry in the logical-to-physical translation table. The semiconductor memory device 50 determines data (valid data) stored in a page (valid page) whose bit vector in the bit vector table indicates "1" with respect to each of the physical blocks in the channels CH0 to CH4 associated with the logical block of the entry indicated by the index K in the logical-to-physical translation table and reads all of the valid data to the data buffer 67. The semiconductor memory device 50 extracts the logical block address added to the valid data (step S47).

The semiconductor memory device 50 writes each piece of the valid data read in step S47 in a manner similar to the writing of data performed in response to the write command as described above. That is, the semiconductor memory device 50 determines a channel to which the valid data is to be written from the channels CH0 to CH4 in the round-robin manner and writes the valid data to a page indicated by the write pointer in an erased block in the semiconductor memory element 58 in the channel. After that, the semiconductor memory device 50 updates the write pointer so as to point a next unwritten page following the page to which the valid data is written. The redundant information is calculated on the basis of the data written in the channels CH0 to CH4 and is written in the channel CH5. The semiconductor memory device 50 records the association between the logical block address added to the written valid data and the physical block address of the page in which the valid data is written into the forward-lookup table to update the table (step S48). The method of updating the forward-lookup table is as described above. In the compaction, by updating the forward-lookup table, the association between the logical block address and the physical block address of data can be always held normally. Since a logical block address is added to data, the association between the logical block address and a physical block address in which the data is written can be easily updated in performing the compaction.

When reading from the data buffer 67 of data in all of valid pages loaded to the data buffer 67 is finished (YES in step S49) and the writing to the semiconductor memory element 58 is finished, the semiconductor memory device 50 performs erasing operation on the physical blocks in the channels CH0 to CH5 associated with the logical block as candidates to be subjected to compaction in step S46, and finishes the compaction process.

The timing of performing the compaction process may be, for example, a timing when the number of free blocks that is obtained by a check upon constitution of the logical block becomes equal to or less than a predetermined number.

As described above, in the configuration of using a plurality of semiconductor memory elements so that data can be accessed even when any of the semiconductor memory elements is faulty, data is written on the page unit basis. Data larger than the page size is divided in units of a page. After that, the divided pieces of data are allocated to the semiconductor memory elements 58 and written to the pages in each of the semiconductor memory elements 58 so that writing operations to the semiconductor memory elements 58 are uniformly performed. By writing redundant information for data written to the pages in the plurality of semiconductor memory elements into pages of a single semiconductor memory element, an error correction code is constituted by the pages of the plurality of semiconductor memory elements. Data reading is performed on the page unit basis and, when abnormality occurs in data, it is regarded that abnormality occurs in a page in a semiconductor memory elements 58 to which the data is written, data is restored by using an error correction code constituted among the semiconductor memory device includes the abnormal page and the other semiconductor memory elements.

With such a configuration, with respect to writing of data to a plurality of pages (five pages in the above-described example), pages used for writing of redundant information corresponding to the data can be suppressed to fewer pages (one page in the above-described example) than used for writing of data. In contrast, in RAID of an HDD, with respect to writing of data of one page, writing of redundant information corresponding to the data is one page. In the embodiment, the writing of redundant information can be suppressed to 1/N (one fifth in the above-described example). As described above, since the number of writing times is limited in a semiconductor memory element of an NAND type, while suppressing the number of times of writing redundant information, the reliability of the semiconductor memory device 50 can be improved.

In the RAID of an HDD, when abnormality occurs in data, it is regarded that the entire HDD in which the data is stored becomes faulty, the HDD is detached, and the data is restored with an error correction code constituted among the HDD storing the fault data therein and other HDDs. In the embodiment, even when abnormality occurs in data, it can be handled as a failure of a block or a page as a part of the semiconductor memory element, not as a failure of the entire semiconductor memory element. Consequently, an error in a smaller unit can be also handled. Even when an entire semiconductor memory element becomes faulty, data written in the semiconductor memory element can be restored with an error correction code constituted among the semiconductor memory element storing the fault data therein and other semiconductor memory elements. Therefore, extremely high reliability can be realized.

With such a configuration, even when abnormality occurs in data due to a failure or the like in a semiconductor memory element, the data can be restored with an error correction code. Consequently, the reliability of the semiconductor memory device 50 can be improved, and increase in the number of writing times of a semiconductor memory element which is limited can be suppressed.

In the embodiment, by providing the bit vector table, compaction can be efficiently performed at high speed. To perform compaction, the semiconductor memory device 50 has to identify a valid page in which valid data is written in a block, obtain a logical block address corresponding to the valid page, move the valid data, and perform an updating process of associating the logical block address with a physical block address of a page to which the data is moved. Identification of a valid page and updating of a physical block address can be performed via a forward-lookup table. However, the forward-lookup table is constituted by being optimized to a search using a logical block address as an index. Consequently, identification of a valid page and updating of a physical block address via a forward-lookup table at the time of performing compaction causes increase in penalty in search time.

A logical block subjected to be compaction has desirably small number of valid pages. This reason is that, by moving a valid page by compaction, a number of free blocks are obtained. To select a logical block having small number of valid pages, an entry having small number of bit vectors having a value of "1" may be selected. To count the number of bit vectors having a value of "1", for example, population computation (counting of the number of bits having a value of "1" in a word) may be provided. However, when the bit width of an entry is large (320 bits in the example), it is difficult to calculate the number of bits in one cycle. Consequently, in the embodiment, the semiconductor memory device 50 updates the value of the counter of the number of valid pages shown in FIG. 5 in accordance with a change in the value of the bit vector. At the time of retrieving a logical block to be subjected to compaction, by retrieving an entry having the smallest number of the counter of valid pages in the bit vector table, the logical block is obtained. An entry in which the value of the counter of the number of valid pages is the smallest can be retrieved by once reading each of the values of the counters of the number of valid pages of entries related to all of logical blocks. Therefore, in the semiconductor memory device 50 in the embodiment, by referring to the bit vector table, a logical block having small number of valid pages can be easily retrieved, and compaction can be performed efficiently at high speed.

MODIFICATIONS

The invention is not limited to the embodiment presented above, but may be embodied with various modified components in implementation without departing from the spirit of the inventions. Further, the invention can be embodied in various forms by appropriately combining a plurality of components disclosed in the embodiment. For example, some of the components presented in the embodiment may be omitted. Further, some components in different embodiments may be appropriately combined. In addition, various modifications as described as examples below may be made.

In the above-described embodiment, various programs executed in the semiconductor memory device 50 may be stored on a computer connected to a network such as the Internet, and provided by being downloaded via the network. The various programs may be recorded in computer readable recording medium such as a CD-ROM, a flexible disk (FD), a CD-R, or a digital versatile disk (DVD) in a form of a file that can be installed or executed, and provided as a computer program product.

In the above-described embodiment, a part of the function of the processor 51 may be implemented by hardware. The semiconductor memory device 50 may have a plurality of processors 51, and the above-described functions may be implemented by the plurality of processors 51. With such a configuration, higher processing speed can be achieved.

In the above-described embodiment, the forward-lookup table and the bit vector table are stored in the DRAM 54, but the invention is not limited thereto. For example, the tables may be stored in the semiconductor memory element 58 and cached in the DRAM 54 when the tables are used by the processor 51.

In the above-described embodiment, an ECC code is added to each data in a unit of a page as a page ECC. However, the ECC code may be added to a unit smaller than a page (for example, a unit of a sector of 512 bytes). With such a configuration, in the case where an error in data cannot be corrected in a unit smaller than a page, it may be regard that abnormality occurs in the data and restore the data by using an error correction code made by a plurality of channels.

In the above-described embodiment, a unit of constituting an error correction code by a plurality of channels is set as a byte, but the invention is not limited thereto and may use a size larger or smaller than byte as a unit. Although a parity code is used as an error correction code, the invention is not limited to the parity code. A plurality of pieces of redundant information may be set and a Reed Solomon code may be used. With the Reed Solomon Code, data in which abnormality occurs due to failures in a plurality of semiconductor memory elements 58 can be restored.

In the above-described embodiment, the number of channels to which data is written is four, the number of channels to which redundancy information for the data is written is one, and the number of channels constituting an error correcting code is five, but the invention is not limited thereto. Further, in the above-described embodiment, the channel to which redundancy information constituting an error correcting code is written is fixed to the channel CH5, but the invention is not limited to the channel. The channels may be allocated to units each constituting an error correction code.

In the above-described embodiment, the channels correspond one-to-one to the semiconductor memory elements 58, but the invention is not limited thereto. The channels may correspond one-to-multiple to the semiconductor memory elements 58, that is, a plurality of semiconductor memory elements 58 may be allocated to one channel. In this case, identification numbers for identifying the respective semiconductor memory elements 58 are allocated to the semiconductor memory elements 58. The identification numbers and physical block addresses are recorded for each block of each channel. For example, if eight semiconductor memory elements are allocated to each channel, a total of 15 bits including 3 bits for identifying the semiconductor memory elements and 12 bits for identifying 4,096 blocks included in each semiconductor memory element are recorded as the identification number and the physical block address of each of blocks of each channel in the logical-to-physical translation table.

In the foregoing embodiment, to simplify mounting of the logical-to-physical translation table, desirably, the number of entries in the logical-to-physical translation table and the number of blocks in each channel. Since the number of entries on the logical-to-physical translation table and the number of physical blocks in the channel CH0 are equal to each other, the logical-to-physical translation table may be constructed so that a location where an entry of a logical block is recorded can be determined by the physical block number of the physical block in the channel CH0. The physical block numbers are given, for example, in ascending order to physical blocks included in the channel. In this case, the physical block number of the physical block in the channel CH0 may be set as the logical block number serving as an index of the logical-to-physical translation table. Alternately, entries in the logical-to-physical translation table may be recorded in a free list structure.

In the above-described embodiment, the semiconductor memory device 50 adds a logical block address to write target data in the semiconductor memory element 58. However, the semiconductor memory device 50 may further include a physical-to-logical translation table (different from the logical-to-physical translation table) showing association between the physical block address, as an index, of data written in the semiconductor memory element 58 and the logical block address of the data, instead of adding the logical block address. Then, in compaction, the semiconductor memory device 50 may use the physical block address of valid data read from the semiconductor memory element 58, refer to the physical-to-logical translation table to obtain the logical block address corresponding to the physical block address, and update the forward-lookup table as a result of compaction using the obtained logical block address.

In the above-described embodiment, when allocating channels to the write target data, in the case where a state where there is no write target data continues for predetermined time after allocating data to at least one of the channels CH0 to CH3, dummy data (for example, data whose bits are all "0") in a corresponding page in a channel to which the write target data is not allocated out of the channels CH1 to CH4, and redundant information calculated by using data in corresponding pages in the channels CH1 to CH4 is written in the corresponding page in the channel CH5. With such a configuration, the possibility such that an error correction code is not constituted for data in a channel to which data has been already written in corresponding pages in the channels CH0 to CH4 and, when an error occurs in the data, the data cannot be restored can be avoided.

According to the present invention, while suppressing increase in the number of times of writing data to semiconductor memory chips, a failure in the semiconductor memory chips can be addressed, and reliability can be improved.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirits of the inventions.

What is claimed is:

1. A controller that writes data into a plurality of semiconductor memory chips, the data having a plurality of pieces of first data in a predetermined unit, the controller comprising:

a write controller configured to write each of the pieces of the first data in a location to which writing is to be performed in an erased storage region in each of the plurality of the semiconductor memory chips and to write redundancy information in a location to which writing is to be performed in an erased storage region in a semiconductor memory chip that is different from semiconductor memory chips to which the pieces of the first data are written, the redundancy information being calculated by using the pieces of the first data, each of the pieces of the first data including page error correcting information, which detects and corrects a memory error; and a storage unit configured to store therein identification information and region specifying information so as to be associated with each other, the identification information associating the pieces of the first data and the redundancy information, and the region specifying information specifying a plurality of storage regions in the semiconductor memory chips to which the pieces of the first data and the redundancy information associated with each other are written, wherein the redundancy information is obtained by calculating an exclusive OR in bytes at respective corresponding offset locations in the pieces of the first data, and when the memory error is not corrected by using the page error correcting information, each of the pieces of the first data is restored by calculating an exclusive OR in bytes at respective corresponding offset locations in the redundant information and remaining pieces of the first data.

2. A controlling method for writing data into a plurality of semiconductor memory chips, the data having a plurality of pieces of first data in a predetermined unit, the method comprising:

writing each of the pieces of the first data in a location to which writing is to be performed in an erased storage region in each of the plurality of the semiconductor memory chips and writing redundancy information in a location to which writing is to be performed in an erased storage region in a semiconductor memory chip that is different from semiconductor memory chips to which the pieces of the first data are written, the redundancy information being calculated by using the pieces of the first data, each of the pieces of the first data including page error correcting information, which detects and corrects a memory error; and storing identification information and region specifying information so as to be associated with each other, the identification information associating the pieces of the first data and the redundancy information, and the region specifying information specifying a plurality of storage regions in the semiconductor memory chips to which the pieces of the first data and the redundancy information associated with each other are written, wherein the redundancy information is obtained by calculating an exclusive OR in bytes at respective corresponding offset locations in the pieces of the first data, and when the memory error is not corrected by using the page error correcting information, each of the pieces of the first data is restored by calculating an exclusive OR in bytes at respective corresponding offset locations in the redundant information and remaining pieces of the first data.

* * * * *